Jan. 5, 1960 D. COHEN 2,920,285

APPARATUS FOR LOCKED OSCILLATOR FREQUENCY DIVISION

Filed April 4, 1957

INVENTOR.
DAVID COHEN
BY Harry M. Saragovitz
ATTORNEY

United States Patent Office 2,920,285

Patented Jan. 5, 1960

2,920,285

APPARATUS FOR LOCKED OSCILLATOR FREQUENCY DIVISION

David Cohen, Laurelton, N.Y., assignor to the United States of America as represented by the Secretary of the Army Application April 4, 1957, Serial No. 650,800

12 Claims. (Cl. 331—42)

The present invention relates to a method and apparatus for locked oscillator frequency division, and more particularly to a method and apparatus for locked oscillator frequency division using a series diode mixer.

The phenomenon of gas molecular resonance at microwave frequencies has been applied in the use of gas absorption spectra as frequency standards. For example, the 3.3 absorption line of ammonia which exists at 23,770.1 mc./s. has been utilized in the atomic clock. Since there is a need for frequency standards at lower microwave frequencies, a method of supplying such standards with the use of gas absorption spectra is desirable. This may be accomplished in either of two ways:

(1) A low frequency source may be provided whose multiplied frequency excites the absorption line. Such a system requires suitable frequency stabilization and error correction.

(2) The absorption line may be excited directly from a suitable high frequency source and this frequency divided in integer steps.

The latter method has a decided advantage over the former in that the former method requires a servo tie system whose error is minimized whereas the latter is a phase lock system.

It should be understood that in this specification the low frequency source is at times referred to as divided frequency source, free running oscillator, and unstable frequency source; and the high frequency source is at times referred to as synchronizing frequency source, injection frequency source, driven source, stable source, and source of frequency to be divided.

From the theoretical standpoint a frequency divider must contain a free running oscillator which can be synchronized (a driven oscillator) or an oscillating loop at the divided frequency (this loop may be free running or of a regenerative nature keyed by the signal to be divided), and if the division ratio is other than 2:1 the divided frequency must have sufficient harmonic content to provide good mixing action with the driving signal. In addition tuned networks as well as comparison circuits, such as a balanced modulator, mixer, etc., are necessary.

The invention disclosed herein is a locked oscillator type of divider with an external modulator for mixing purposes. The principle of this type of divider can best be explained by a detailed analysis of the effect of a load on a free running oscillator and by demonstrating how the modulator acts as a variable load to lock the frequency.

In general, it may be stated that the frequency of an oscillator varies as a function of its load susceptance and the power output varies as a function of the load conductance. However, in a non-linear oscillator the internal beam admittance is affected by load power variations and consequently the locus of load admittance for a constant frequency at variable power does not follow exactly the constant susceptance lines.

If one starts with the premise that an oscillator is in phase lock with an injected source, an analysis can be made concerning the effective susceptance seen by the oscillator at the plane of reference. As a converse it can be shown that it is possible that this susceptance, which varies with phase shift between the two signals, can be used to phase lock the oscillators.

The theory of the locked microwave oscillator representing a two terminal network can begin with a discussion of frequency pulling by a load at a reference plane. It has been demonstrated in MIT Technical Report No. 175 that such an oscillator will phase lock to a stable input signal whose frequency is near the free running oscillator frequency. The effect of the injected signal can be explained as an equivalent load susceptance which varies in magnitude and phase to keep the oscillator in phase lock.

Locked oscillator dividers can be used at lower frequencies because it is possible to inject harmonic synchronizing power directly into the beam of a class C oscillator through the use of electron coupling or through resistive oscillator tube element loads. However, at high frequencies (microwave region) the tube elements are themselves important parts of the oscillating tank circuit and hence reject all signals not at the oscillator tuned frequency. Therefore, at high frequencies (microwave region) if the synchronizing signal (injected signal) is at some harmonic of the oscillator frequency, then it is no longer possible to simply inject the signal as the oscillator tuned network will reject the synchronizing signals. Some means must, therefore, be provided to convert phase information into a useful form. To this end a series diode mixer network, as will be described herein, was devised. Much work has been done to demonstrate the manner in which an oscillator may be locked in phase with a stable signal at the resonant frequency. The type of modulator (diode mixer) described herein derives this lock signal by mixing a stable harmonic driving frequency with the oscillation to be locked. A beat note appears at the oscillator frequency which acts as the locking signal.

It should be noted that when two frequencies are harmonically related, a beat will exist at the lower frequency. This beat note will convey phase information and be accepted by the tuned network at the lower frequency oscillator. For example, to divide 900 mc. to 450 mc., a 450 mc. oscillator must be used. The 900 mc. signal should be suitably isolated and the two signals fed into a crystal mixer. If there exists a match between the 450 mc. oscillator and the crystal impedance, the 450 mc. 1st order beat note will also be matched to the oscillator and act as a synchronizing signal.

The modulator used in the locked oscillator system as described herein is a crystal mixer which appears in a series coupling between the oscillator to be stabilized and the oscillator which applies the injection or synchronizing signal where the synchronizing oscillator is operating at the second or third harmonic of the oscillator to be stabilized.

An object of the present invention is to provide a method and apparatus for frequency division in the microwave region.

Another object of the present invention is to enable the very accurate control of the frequency generated by an U.H.F. oscillator.

A further object of the present invention is to devise novel circuit arrangements for the injection locking of oscillators in the microwave region.

Still a further object of the present invention is the provision of a frequency dividing apparatus having simplicity as concerns the total number of adjustments.

Still another object of the present invention is to provide a method and apparatus for locked oscillator frequency division in the microwave region using the series diode mixer.

The exact nature of this invention as well as other objects and advantages thereof will be readily apparent from consideration of the following specification relating to the annexed drawings in which.

Most microwave oscillators consist of a single re-entrance cavity shunted by a negative beam admittance and a load. Since these oscillators have only output terminals, it is difficult to separate the elements of the oscillating loop for insertion of a harmonic for mixing and locking purposes as is done to advantage at low frequencies. However, the frequency can be varied to some extent by shunting a reactance across the output terminals. The tendency of the load to affect the oscillator frequency is diminished with the use of a buffer amplifier or attenuator between the oscillator and the load. An injection of a signal across the output terminals of such an oscillator will cause a lock under certain conditions, and the phase shift between the oscillations and synchronizing signal will be such as to introduce a susceptance across the oscillator terminals which will keep the oscillator frequency the same as that of the injected signal. Therefore, it is concluded that an oscillator whose frequency is strongly dependent upon load susceptance is most ideally suited for locking.

Figures 1, 2:
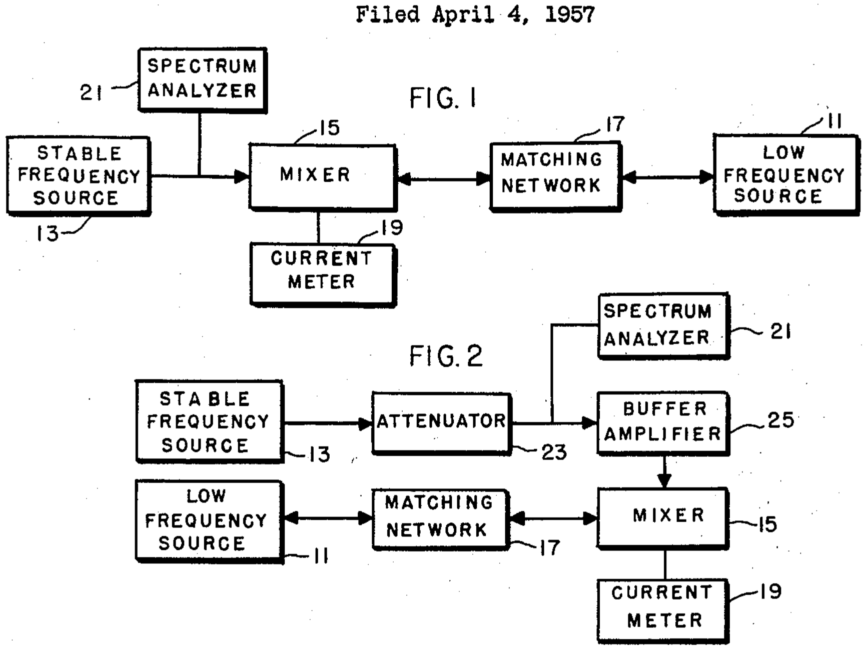
Figure 1 is a block diagram illustrating an embodiment of the invention.
Figure 2 is a block diagram of another embodiment of the invention.
Figure 3:
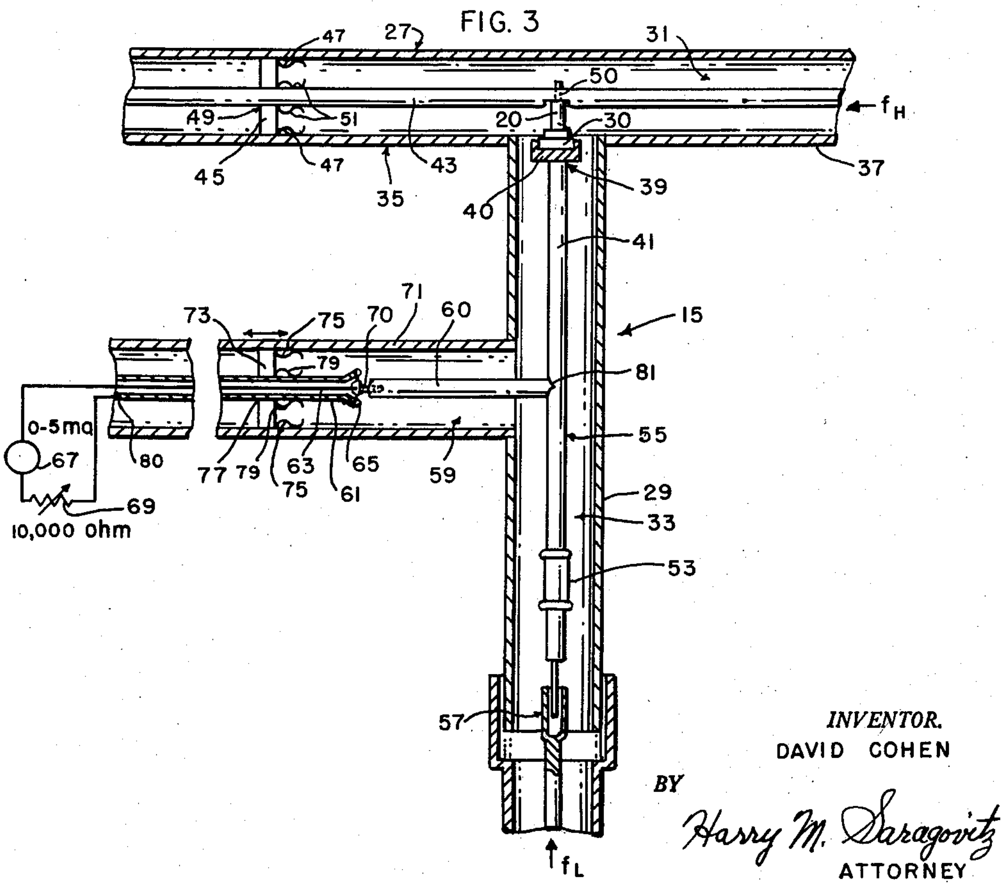
Figure 3 is a structural view, partly in cross section, of a portion of Figures 1 and 2 showing the crystal mixer network and circuitry thereof.

Referring now to the drawings, wherein like reference characters designate like or corresponding parts throughout the several views, there is shown in Figure 1 low frequency source 11, high frequency source 13, external modulator network (mixer network) 15, and matching network 17. Mixer network 15 is in series coupling between high frequency source 13 and matching network 17, and low frequency source 11 is electrically connected in series with matching network 17. Matching network 17 is used to match the output of low frequency source 11 to mixer network 15 and comprises a line stretcher and tuning stub or the like. Thus it can be seen that the mixer network 15 is connected electrically in series between high frequency source 13 and low frequency source 11. Mixer network 15 comprises, preferably, crystal diode mixer 20 as depicted in Figure 3.

A current meter 19 is electrically connected to mixer network 15 to provide a means for measuring the mixer current. Lock information is monitored by observing the abrupt changes in mixer current on current meter 19. A spectrum analyzer 21, a more valid lock indicator as all the sideband beat frequencies abruptly disappear as the oscillator comes into lock, is tuned to the frequency of the high frequency source 13 and is electrically connected to the junction between mixer network 15 and high frequency source 13. It should be understood that while other indicating means can be used as a lock indicator the preferred means are discussed herein.

Figure 2 discloses another embodiment of the invention in which stable source 13 is not connected directly to mixer network 15 but is instead connected to mixer network 15 by attenuator 23 and buffer amplifier 25. Attenuator 23 is electrically connected in series between stable source 13 and buffer amplifier 25, and buffer amplifier 25 is electrically connected in series with mixer network 15. Spectrum analyzer 21 is connected to the junction between buffer amplifier 25 and attenuator 23. It should be understood that spectrum analyzer could also be coupled loosely to any junction of the system.

Buffer amplifier 23, tuned to the frequency of high frequency source 13, is used to isolate high frequency source 13 to prevent the low frequency from pulling the high frequency, and attenuator 23 is employed due to the insertion gain of buffer amplifier 25.

Figure 3 is a rather detailed showing of a preferred structure of crystal mixer network 15 and related circuitry thereto usable in the system of Figures 1 and 2. It should be noted that Figure 3 also illustrates the current meter 19 and its connections to mixer network 15.

Outer conductors 27 and 29 of coaxial cables 31 and 33, respectively, are joined together with coaxial cables 31 and 33 substantially perpendicularly. It should be understood that coaxial cables 31 and 33 need not be connected perpendicularly but are connected so purely for convenience. When coaxial cables 31 and 33 are perpendicular to each other, it can be seen from Figure 3 that coaxial cables 31 and 33 form a T with coaxial cable 31 being the cross member of the T and coaxial cable 33 being the upright member of the T. Coaxial cable 31 has a first arm 35 forming a stub and second arm 37 as a feed for a synchronizing signal $f_H$. These coaxial cables have a nominal characteristic impedance of 50 ohms, the outer conductors thereof each having an outer diameter of ⅝ inch and inner diameter of 9⁄16 inch; the inner conductors thereof each are nominally 0.244 inch. It should be understood that these inner conductors can be conductive rods.

A portion of inner conductor 41 of coaxial cable 33 is removed at end 39 and a short piece of oversize center conductor 40 having a counter-bore 30 therein is connected thereto. Inner conductor 43 of coaxial cable 31 has a flat milled therein and a hole 50 therethrough at a portion thereof where inner conductor 41 of coaxial cable 33 would normally be connected. Thus the milled section having hole 50 therethrough and the counter-bored oversize center conductor 40 are located at the junction formed by coaxial cables 31 and 33.

Contained within the housing of the T is crystal diode mixer 20 (type 1N21B). The pin end of this crystal 20 fits into hole 50 and makes an electrical connection with inner conductor 43 of coaxial cable 31; and the base end of crystal 20 fits in, is supported by, and makes electrical contact with counter-bore 30 of oversize center conductor 40.

It should be understood that the portion of the T having the crystal housed therein can be replaced by a modified T section which can be connected by coaxial connectors to coaxial cables 31 and 33. The center conductor of the T section would be removed and the through arm would be replaced by a piece of ¼ inch brass rod. The flat would be milled at the center of this rod and a hole would be drilled to receive the point end of the crystal.

Further examples of adapters or mounts for cartridge type crystal mixers may be found, for example, in Patents Nos. 2,543,809, 2,605,399, 2,664,502 and 2,734,170.

A shorting bar 45, coaxial with first arm 35 of coaxial cable 31, is contained within outer conductor 27 of coaxial cable 31 and electrically connects inner conductor 43 to outer conductor 27. At the periphery of shorting bar 45 are a plurality of resilient, electrical conductive fingers 47 which make electrical contact with outer conductor 27 of coaxial cable 31 and hold the shorting bar 45 in position. Shorting bar 45 has an aperture 49 therein through which inner conductor 41 of coaxial cable 31 passes. Inner conductor 43 of coaxial cable 31 makes electrical contact through a plurality of resilient, electrical conductive fingers 51 which are attached to shorting bar 45 near aperture 49. Thus, shorting bar 45 acts to adjust the electrical length of stub 35. It should be noted that the synchronizing signal $f_H$ is connected in parallel with adjustable stub 35.

Contained within coaxial cable 33 is coupling capacitor 53 which electrically connects first portion 55 of inner conductor 41 of coaxial cable 33 to second portion or adjustable line 57 of inner conductor 41 of coaxial cable 33. Thus, as seen in Figure 3, first portion 55 of inner conductor 41 of coaxial cable 33 connects crystal diode mixer 20 to coupling capacitor 53 while second portion (line stretcher or adjustable line) 57 connects coupling capacitor 53 to low frequency source 11 (of frequency $f_L$) as depicted in Figures 1 and 2. It should be noted that line stretcher 57, shown schematically in Figure 3, is matching network 17, as shown in Figures 1 and 2.

Coupling capacitor 53, shown in Fig. 3 in general outline only, is a commercial item and is of the coaxial type. It consists of a ceramic tube whose inside and outside surfaces are silver-plated and form inner and outer electrodes respectively. These inner and outer electrodes are electrically connected in series with inner conductor 41 of coaxial cable 33 by means of adapter fingers. Coupling capacitor 53 can also comprise, for example, a pair of metallic discs (electrodes) whose spacing can be varied at will. See, for example, Patent No. 2,233,166.

Coaxial adjustable stub 59 has a portion of its inner conductor 60 replaced by a ¼ inch O.D. brass tubing 61, a center insulated wire 63, and a silver mica series button capacitor 65. Capacitor 65, having a value of 500 mmfd., has its perimeter soldered to brass tubing 61. A small screw 70 passes through the center of the button capacitor 65; its head end is electrically connected to insulated wire 63 at one end thereof and its threaded portion is screwed into one end of inner conductor 60. The other end of inner conductor 60 is electrically connected to portion 55 of inner conductor 41 of coaxial cable 33 at point 81 as shown in Fig. 3. Center insulated wire 63 passes through brass tubing 61 and has its other end electrically connected to one terminal of D.C. ma. meter 67. The other terminal of D.C. ma. meter 67 is electrically connected to one side of variable current limiting resistor 69; the other side of the current limiting resistor is connected to brass tubing 61 at terminal 80. Outer conductor 71 of coaxial cable 59 is connected substantially perpendicularly to outer conductor 29 of coaxial cable 33. It should be understood that this connection is perpendicular purely for convenience and should not be considered as a limiting factor of the external modulator's design.

A shorting bar 73, having a plurality of resilient, electrically conductive fingers 75 attached substantially at its outer periphery for making electrical contact with outer conductor 71 of stub 59 and for aligning shorting bar 73 with stub 59, has an aperture 77 therethrough substantially at the center thereof to allow brass tubing 61 to pass therethrough. Brass tubing 61 makes electrical contact with shorting bar 72 through a plurality of resilient, electrically, conductive fingers 79 attached near aperture 77. Thus it can be seen that shorting bar 73 is a means for adjusting the electrical length of stub 59.

The inner conductors of the coaxial cables can be supported and insulated from the outer conductors by insulating bushings or the like (not shown).

The invention operates as follows:

If, for example, 900 mc. is to be divided down to 450 mc., the synchronizing source 13 as depicted in Figures 1 and 2, will be a stable high frequency 900 mc. oscillator. With only synchronizing source 13 electrically connected to crystal diode mixer 20 of mixer network 15, as shown in Figure 1, and stub 35, as depicted in Figure 3, adjusted to properly match stable source 13 to crystal diode mixer 20 of mixer network 15, spectrum analyzer 21 is tuned to 900 mc. It should be noted that if buffer amplifier 25 and attenuator 23, as depicted in Figure 2, are to be used in the system as depicted in Figure 1, the spectrum analyzer 21 is tuned to 900 mc. and the buffer amplifier 25 is tuned and coupled to modulator 15. When buffer amplifier 25 is in tune, the mixer current, or as disclosed in Figure 3 the crystal current, as indicated on current meter 19, should read in the order of one to two ma. In the preferred embodiment the crystal diode mixer 20 can be considered as a 1N21B silicon crystal diode.

The 900 mc. high frequency source 13 is next disconnected, and low frequency source 11 is tuned to approximately the sub harmonic frequency, 450 mc. in this example, as indicated by spectrum analyzer 21. Line stretcher 57, shown schematically in Figure 3 and contained within matching network 17 of Figures 1 and 2, and meter resistance 69, as shown in Figure 3, are adjusted for a peak current reading of about 4 ma. Since the load varies the frequency by a considerable amount some retuning may be necessary. Now with both sources 11 and 13 connected the system is in lock. It should be noted that tuning low frequency source 11 into and out of lock has no apparent effect on high frequency source 13. This setup as herein described can also be used to divide 900 mc. to 300 mc.

The following are important considerations:

(1) When the decoupling is sufficient, low frequency source 11 will not affect high frequency source 13.

(2) The 900 mc. high frequency source 13 pulls and locks the 450 mc. source 11.

(3) The 450 mc. source 11 is pulled by the 900 mc. high frequency source 13 even before going into lock.

(4) Beats appear as side bands when the system is out of lock.

It should be noted that for best 2 :1 pulling one needs a low capacity tank circuit, a large coupling factor to the load, a large driving signal, and a large square law coefficient for mixer network 15. Pulling depends only on the tank or cavity and not on the oscillator due to the approximation that the beam admittance does not vary during the pulling.

In summary it can be said that crystal diode mixer 20 of mixer network 15 derives the locking signal by mixing a stable harmonic driving frequency with the oscillation to be locked. A beat note, which acts as the locking signal appears at the frequency of the low frequency source 11. The phase shift between the two signals, which causes the susceptance to vary, can be used to phase lock low frequency source 11. It should be noted that since the load affects free running oscillator (low frequency source) 11, crystal diode mixer 20 of mixer network 15 acts as a variable load to low frequency source 11 and locks the frequency of low frequency source 11. When lock is achieved, the beats blend into one signal and the D.C. crystal current gives a sharp kick as indicated on D.C. ma. meter 67.

It should be understood, of course, that the foregoing disclosure relates to only preferred embodiments of the invention and that numerous modifications or alterations may be made therein without departing from the spirit and scope of the invention as set forth in the appended claims.

What is claimed is:

1. A circuit for stabilizing the frequency of a low frequency source by a high frequency source, comprising a high frequency source; a buffer amplifier; an attenuator electrically connected between said high frequency source and said buffer amplifier; said buffer amplifier being tuned to the frequency of said high frequency source to isolate said high frequency source from the output of said low frequency source, said attenuator reducing the insertion gain of said buffer amplifier; a matching network; a mixer electrically connected in series between said buffer amplifier and said matching network; and a low frequency source electrically connected to said matching network, said matching network matching the output from said low frequency source to said mixer, said mixer acting as a variable susceptance load to said low frequency source to lock the frequency of said low frequency source to a subharmonic frequency of said high frequency source.

2. The circuit of claim 1 wherein said mixer is a crystal diode and said high frequency source is operating at some harmonic frequency of said low frequency source.

3. A circuit for stabilizing the frequency of a low frequency oscillator by a high frequency oscillator comprising a high frequency oscillator; a matching network; a mixer electrically connected in series between said high frequency oscillator and said matching network; and a low frequency oscillator connected to said matching network, said high frequency oscillator being harmonically related to said low frequency oscillator, said two harmonically related frequencies causing a beat note to exist at the lower frequency, said beat note conveying phase information to said low frequency oscillator to lock said low frequency oscillator to a subharmonic frequency of said high frequency oscillator.

4. The circuit of claim 3 wherein said mixer is a crystal diode which is in series coupling between said low frequency source and said high frequency source.

5. A circuit for stabilizing the frequency of a low frequency source by a high frequency source comprising a low frequency source, a high frequency source, and a mixer network, said mixer network comprising a mixer and first and second coaxial cables having first and second inner and outer conductors respectively, said first and second outer conductors being joined, said mixer being at the junction of and connecting said first and second inner conductors, said first inner conductor being connected to said high frequency source and said second inner conductor being connected to said low frequency source, said mixer thus being electrically connected in series between said high and low frequency sources, said first and second outer conductors being common ground.

6. In a locked frequency divider network comprising a low frequency source, a high frequency source, and a mixer network, said mixer network comprising a first coaxial cable having first inner and first outer conductors; a second coaxial cable having second inner and second outer conductors; said first and second coaxial cables connected substantially perpendicularly and being T-shaped, said first coaxial cable being the cross member of said T and said second coaxial cable being the upright member of said T; a mixer; said mixer contained within the housing of said T and substantially at the junction formed by said first and second coaxial cable, said mixer being electrically connected between an end of said second inner conductor and said first inner conductor; a coupling capacitor, said coupling capacitor connected to the other end of second inner conductor; said cross member of said T having first and second arms, said first arm connecting to said high frequency source; a first shorting bar connected electrically between said first inner and outer conductors of said second arm, said first shorting bar adjusting the electrical length of said second arm; a third coaxial cable connected to said second coaxial cable substantially perpendicularly thereto, said third coxail cable having a third outer conductor and a center wire therein, said center wire having an end thereof electrically connected to said second inner conductor between said mixer and said coupling capacitor, said third outer conductor connected to said second outer conductor; a tubing surrounding a portion of said center wire; a second shorting bar electrically connecting said third outer conductor to said tubing to adjust the electrical length thereof; a series button condenser electrically coupling said tubing to said center wire; a current limiting resistor; a D.C. ma. meter to measure the crystal current connected between the other end of said center wire and said current limiting resistor, the other end of said current limiting resistor connecting to said tubing; a line stretcher connected to said second coxial cable connecting said coupling capacitor to said low frequency source, said first, second, and third outer conductors being a common ground.

7. The locked frequency divider network of claim 6 wherein said mixer is a crystal diode.

8. A mixer network comprising a crystal diode mixer; a first coaxial cable having first inner and outer conductors; a second coaxial cable having second inner and outer conductors, said first and second coaxial cables being connected by said first and second outer conductors respectively, said first and second coaxial cables forming a T, said first coaxial cable being the cross member of said T and said second coaxial cable being the upright member of said T, said cross member having first and second arms, said first arm acting as a first input, said second arm having a first adjustable shorting bar making electrical contact between said first inner and outer conductors and contained within the housing of said outer conductor, said crystal diode mixer electrically connected between said first inner conductor and an end of said second inner conductor, said crystal diode mixer contained within and at the junction of said first and second coaxial cables; a coupling capacitor; a matching network, said matching network being a line stretcher, said line stretcher being a portion of said second inner and outer conductors, said coupling capacitor electrically connected between said crystal diode mixer and an end of said portion of said second inner conductor forming said line stretcher, the other end of said line stretcher acting as a second input; a third coaxial cable having third inner and outer conductors, said third coaxial cable and said second coaxial cable being connected substantially perpendicularly by said third and second outer conductors respectively, said third inner conductor electrically connected to said second inner conductor at a point on said second inner conductor between said crystal diode mixer and said coupling capacitor; and a second adjustable shorting bar contained within the housing of said third outer conductor and electrically connecting said third outer conductor to said third inner conductor, said third coaxial cable and said second adjustable shorting arm behaving as a stub, said stub being used for connecting an indicating meter.

9. The mixer network of claim 8 wherein said third inner conductor is replaced by a center wire; a series button condenser; and a conductive tubing, said series button condenser connecting an end of said conductive tubing to said central wire, one end of said central wire and the other end of said conductive tubing acting as said indicating meter terminals, said other end of said central wire connected to said second inner conductor, said second adjustable shorting bar electrically connecting said third outer conductor to said conductive tubing.

10. The mixer network of claim 8 wherein a portion of said third inner conductor is replaced by a center insulated wire, a brass tubing, and a series button capacitor, said series button capacitor having a screw passing through the center thereof, said screw being threaded into the portion of said third inner conductor and electrically connected thereto, the perimeter of said series button capacitor connected to one end of said brass tubing, said center insulated wire passing through said brass tubing longitudinally and having an end thereof electrically connected to the head of said screw, the other end of said brass tubing and said insulated center wire acting as said indicator meter terminals, said second adjustable shorting bar electrically connecting said third outer conductor to said brass tubing.

11. The mixer network of claim 8 wherein said first inner conductor has a portion thereof flat milled with a hole passing therethrough to position the pin end of said crystal diode mixer, said pin end of said crystal mixer making electrical contact with said first inner conductor; and said end of said second inner conductor has an oversize center conductor connected thereto, said oversize center conductor having a counter-bore therein, the base end of said crystal diode mixer fitting within said counter-bore, said base end making electrical contact with said second inner conductor.

12. A mixer network comprising a crystal diode mixer; a first coaxial cable having first inner and outer conductors; a second coaxial cable having second inner and outer conductors; said first and second coaxial cables being connected by said first and second outer conductors respectively, said first and second coaxial cables forming a T, said first coaxial cable being the cross member of said T and said second coaxial cable being the upright member of said T, said cross member having first and second arms, said first arm acting as a first input, said second arm having a first adjustable shorting bar making electrical contact between said first inner and outer conductors and contained within the housing of said outer conductor, said first inner conductor having a flat milled therein and a hole therethrough at a portion thereof where said second inner conductor would normally be connected, said second inner conductor having a portion thereof removed at the end thereof that would normally be connected to said first inner conductor; a short piece of oversize center conductor having a counter-bore therein being connected to said end of said second inner conductor, the pin end of said crystal diode mixer being positioned within said hole and making electrical contact with said first inner conductor, the base end of said crystal diode mixer fitting within said counter-bore and making electrical contact with said second inner conductor, said crystal diode mixer therefore being contained within and at the junction of said first and second coaxial cables; a coupling capacitor; a matching network, said matching network being a line stretcher, said line stretcher being a portion of said second inner and outer conductors, said coupling capacitor electrically connected between said crystal diode mixer and said portion of said second inner conductor forming said line stretcher at an end thereof, the other end of said line stretcher acting as a second input; a third coaxial cable having third inner and outer conductors, said third coaxial cable and said second coaxial cable being connected substantially perpendicularly by said third and second outer conductors respectively, said third inner conductor being electrically connected to said second inner conductor at a point on said second inner conductor between said crystal diode mixer and said coupling capacitor; a portion of said third inner conductor being replaced by a center insulated wire, a brass tubing, and a series button capacitor; said series button capacitor having a screw passing through the center thereof, said screw being threaded into the portion of said third inner conductor and electrically connected to said second inner conductor, the perimeter of said series button capacitor connected to one end of said brass tubing, said center insulated wire passing through said brass tubing longitudinally and having an end thereof electrically connected to the head of said screw; a second adjustable shorting bar contained within the housing of said third outer conductor and electrically connecting said third outer conductor to said brass tubing, said third coaxial cable and said second adjustable shorting arm behaving as a stub, the other end of said brass tubing and said insulated center wire acting as terminals for an indicating meter.

References Cited in the file of this patent

UNITED STATES PATENTS

| | | |
|---|---|---|
| 2,408,420 | Ginzton | Oct. 1, 1946 |
| 2,436,830 | Sharpless | Mar. 2, 1948 |
| 2,691,105 | Schwartz | Oct. 5, 1954 |

FOREIGN PATENTS

| | | |
|---|---|---|
| 673,012 | Great Britain | May 28, 1952 |